(12) United States Patent
Brown

(10) Patent No.: US 6,225,833 B1
(45) Date of Patent: May 1, 2001

(54) DIFFERENTIAL SENSE AMPLIFIER WITH VOLTAGE MARGIN ENHANCEMENT

(75) Inventor: Jeff S. Brown, Forts Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/426,919

(22) Filed: Oct. 26, 1999

(51) Int. Cl.[7] .............................. G01R 19/00; H03F 3/45
(52) U.S. Cl. .............................................. 327/52; 327/333
(58) Field of Search ................................ 327/51, 52, 55, 327/56, 65, 89, 333; 365/207, 208, 189.11

(56) References Cited

U.S. PATENT DOCUMENTS

| | | | |
|---|---|---|---|
| 4,984,204 | * 1/1991 | Sato et al. ........................ | 365/189.11 |
| 5,398,201 | * 3/1995 | Nambu et al. ..................... | 365/177 |
| 5,587,952 | * 12/1996 | Kitsukawa et al. ................ | 365/207 |
| 5,936,432 | * 8/1999 | Oh et al. ........................... | 327/55 |
| 5,946,251 | * 8/1999 | Sato et al. ......................... | 365/203 |
| 6,075,729 | * 6/2000 | Ohhata et al. ..................... | 365/190 |

* cited by examiner

*Primary Examiner*—My-Trang Nuton

(57) ABSTRACT

A sense amplifier includes a voltage supply terminal, first and second differential bit line inputs and a differential amplifier. The differential amplifier has first and second amplifier inputs, which are coupled to the first and second differential bit line inputs, respectively, and has an amplifier output. A first transistor is coupled between the voltage supply terminal and the first bit line input and has a current control terminal coupled to the second bit line input. A second transistor is coupled between the voltage supply terminal and the second bit line input and has a current control terminal coupled to the first bit line input.

10 Claims, 1 Drawing Sheet

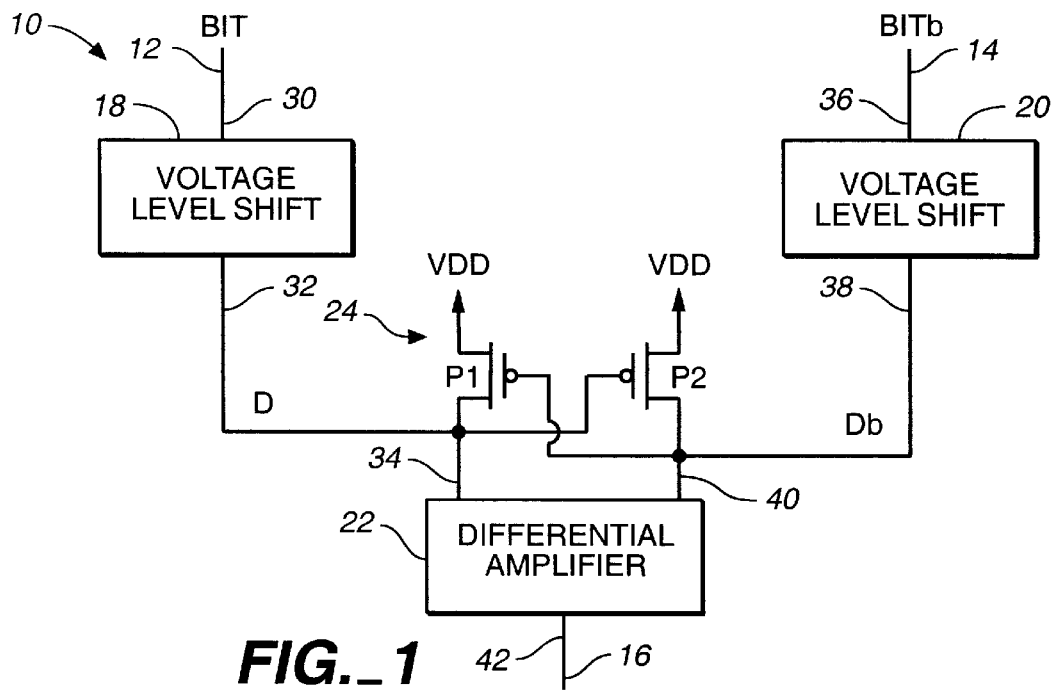
FIG._1
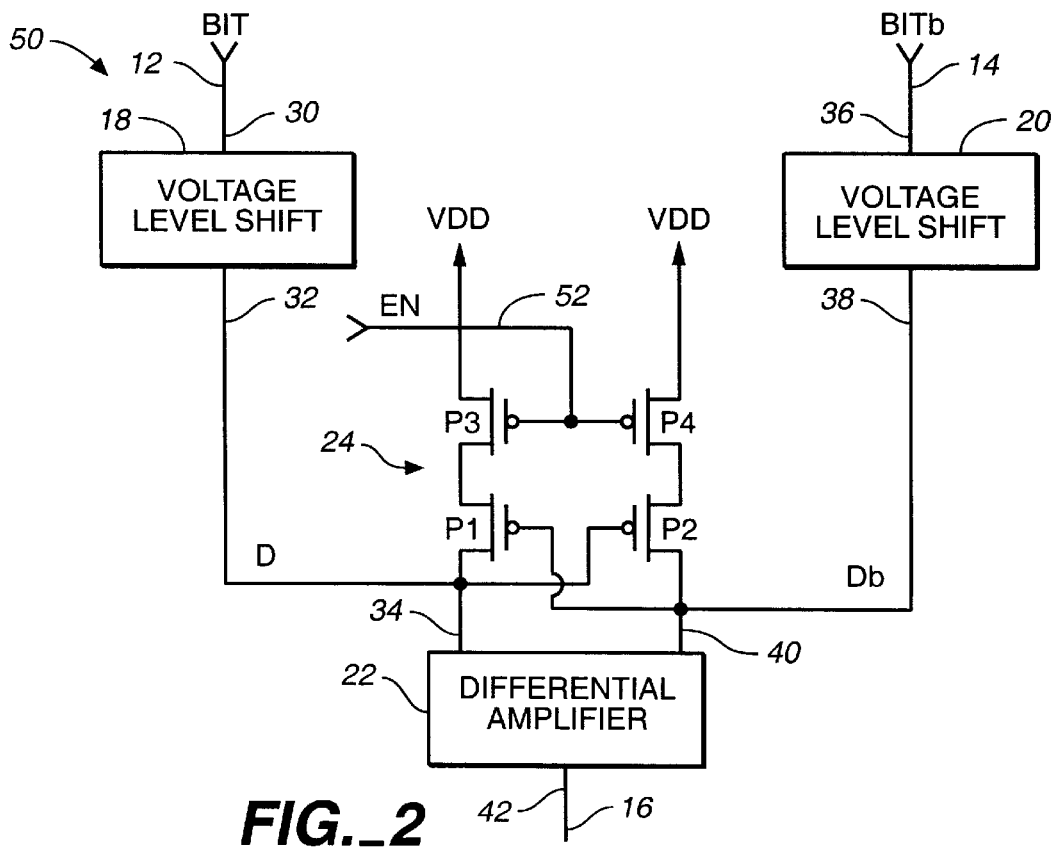
FIG._2

DIFFERENTIAL SENSE AMPLIFIER WITH VOLTAGE MARGIN ENHANCEMENT

BACKGROUND OF THE INVENTION

The present invention relates to semi-conductor memory devices and, in particular, to a differential bit line sense amplifier.

A semi-conductor memory has a plurality of output "bit lines", with each line having a voltage or logic state that is indicative of the data being read from the memory device. The output bit lines are either single-ended or differential and are typically precharged high or low (most often high). During a read operation, the precharge on the bit line is removed and the bit line will then either stay high or fall low, depending upon the data on the bit line.

With differential bit lines only one of the two bit lines in a pair of bit lines will fall low relative to the other bit line, which creates a differential voltage having a polarity indicative of the data being read. A differential sense amplifier senses the differential voltage and generates a single-ended output having a logic state indicative of the differential data. A typical differential sense amplifier includes voltage level shifting circuit, which shifts the voltage levels on the bit lines to where the sense amplifier is most sensitive. Alternatively, the precharge voltage levels can be shifted to place the bit lines at the desired levels.

A difficulty with typical differential sense amplifiers occurs when the amplifier is operated at low power supply voltage levels. As the supply voltage drops, the voltage levels of the differential inputs to the sense amplifier also drop. This reduces the differential voltage presented to the sense amplifier. When both of the sense amplifier inputs drop to a certain voltage level, the sense amplifier will cease to function since the amplifier is not capable of detecting differential voltages when both inputs are below a certain level. One of the inputs to the sense amplifier is required to be above a certain level in order for the sense amplifier to function. Improved differential sense amplifiers are desired, which are capable of operating with lower supply voltages without voltage roll-off at the sense amplifier inputs.

SUMMARY OF THE INVENTION

One aspect of the present invention relates to a sense amplifier, which includes a voltage supply terminal, first and second differential bit line inputs, a differential amplifier and first and second transistors. The differential amplifier has first and second amplifier inputs, which are coupled to the first and second differential bit line inputs, respectively, and has an amplifier output. The first transistor is coupled between the voltage supply terminal and the first bit line input and has a current control terminal coupled to the second bit line input. The second transistor is coupled between the voltage supply terminal and the second bit line input and has a current control terminal coupled to the first bit line input.

Another aspect of the present invention relates to a sense amplifier including first and second differential bit line inputs, a differential amplifier and a voltage compensation circuit. The differential amplifier has first and second amplifier inputs, which are coupled to the first and second differential bit line inputs, respectively, and an amplifier output. The voltage compensation circuit is coupled to the first and second bit line inputs for raising a first voltage level on one of the first and second bit line inputs when a second voltage level on the other of the first and second bit line inputs drops relative to the first voltage level.

Another aspect of the present invention relates to a method of sensing memory data represented by a differential voltage on first and second bit line inputs, wherein the first and second bit line inputs have first and second voltage levels, respectively. The method includes reducing the first and second voltage levels on the first and second bit line inputs to third and fourth voltage levels and raising one of the third and fourth voltage levels when the other of the third and fourth voltage levels drops relative to said one of the third and fourth voltage levels. A data output is generated based on a comparison of the third and fourth voltage levels.

BRIEF DESCRIPTION OF THE DRAWINGS

FIG. 1 is a diagram of a sense amplifier according to one embodiment of the present invention.

FIG. 2 is a diagram of a sense amplifier according to an alternative embodiment of the present invention.

DETAILED DESCRIPTION OF THE PREFERRED EMBODIMENTS

FIG. 1 is a diagram of a sense amplifier 10 according to one embodiment of the present invention. Sense amplifier 10 includes differential inputs 12 and 14 (labeled "BIT" and "BITb"), data output 16, voltage level shifting circuits 18 and 20, differential amplifier 22 and voltage compensation circuit 24. Voltage compensation circuit 24 includes P-channel transistors P1 and P2. Voltage level shifting circuit 18 has an input 30 coupled to bit line input 12 and a voltage-shifted bit line output 32 (labeled "D") coupled to differential amplifier input 34. Similarly, voltage level shifting circuit 20 has an input 36 coupled to bit line input 14 and a voltage-shifted bit line output 38 (labeled "Db") coupled to differential amplifier input 40. Differential amplifier 22 has an amplifier output 42 coupled to data output 16. P-channel transistor P1 has a gate coupled to differential amplifier input 40, a source coupled to voltage supply terminal VDD and a drain coupled to differential amplifier input 34. P-channel transistor P2 has a gate coupled to differential amplifier input 34, a source coupled to voltage supply terminal VDD and a drain coupled to differential amplifier input 40.

During operation, a memory cell of a semi-conductor memory array (not shown) drives bit line inputs 12 and 14 to a differential voltage based on the data being read from the cell. Bit line inputs 12 and 14 are precharged to a logic high level. When the memory cell is accessed, the precharge is removed and one of the bit line inputs 12 and 14 will fall low relative to the other bit line input, depending on the data being read from the cell. This creates a differential voltage between bit line inputs 12 and 14 having a polarity indicative of the data being read from the cell.

Voltage level shifting circuits 18 and 20 shift the voltage levels on bit line inputs 12 and 14 downward to a range at which differential amplifier 22 is most sensitive. In one embodiment, voltage level shifting circuits 18 and 20 include voltage dividers. Other voltage level shifting circuits can also be used. The shifted bit line outputs 32 and 38 are then provided to differential amplifier inputs 34 and 40, respectively.

Differential amplifier 22 compares the voltage levels on bit line outputs 32 and 38 to detect the polarity of the differential voltage, D–Db, and generates data output 42 based on the comparison. Data output 42 has a logic level that is a function of the polarity of the differential voltage applied to inputs 34 and 40 of differential amplifier 22. For example, if bit line output D is relatively positive as compared to bit line input Db, output 42 will be high. If bit line output D is relatively negative as compared to bit line output Db, output 42 will be low. Opposite logic levels can also be used.

In certain applications, the supply voltage level applied to voltage supply terminal VDD drops below or is otherwise set to a level that is less than an intended voltage supply range for sense amplifier 10. A drop in the supply voltage causes a drop in the voltage levels on bit line inputs 12 and 14, which causes a proportional drop in the voltage levels on bit line outputs 32 and 38 of voltage level shifting circuits 18 and 20. This reduces the magnitude of the differential voltages applied to inputs 34 and 40 of differential amplifier 22. If the supply voltage drops too low, the voltage levels on bit line outputs 32 and 38 can shift down to a level where differential amplifier 22 is not very sensitive or is incapable of detecting the differential voltage.

However, at low supply voltages, as the voltage level on one of the bit line outputs 32 and 38 drops in response to the data being read, voltage compensation circuit 24 raises the voltage level on the other of the bit line outputs 32 and 38 such that the differential voltage seen by inputs 34 and 40 of differential amplifier 22 is large enough to be detected. As one of the bit line outputs 32 and 38 falls relative to the other bit line output, the transistor P1 or P2 having its gate coupled to the falling bit line output will begin to conduct more current than the other transistor, which pulls the other bit line output high. For example, if bit line output 32 falls, then transistor P2 will pull bit line output 38 high toward voltage supply terminal VDD since its gate is pulled low by bit line output 32. Similarly, if bit line output 38 falls, then transistor P1 will pull bit line output 32 high since its gate is pulled low by bit line output 38. The resulting increase in the differential voltage at low supply voltage levels allows sense amplifier 10 to operate at a greater supply voltage range without a significant reduction in performance.

The effect of adding transistors P1 and P2 to sense amplifier 10 were simulated with a single port static random access memory (SRAM) in a 0.25 micron complementary metal oxide semi-conductor (CMOS) integrated circuit with a 1.8 volt supply voltage. The addition of transistors P1 and P2 in the sense amplifiers resulted in up to 65% faster sensing at −10% of the original supply voltage (i.e. at a supply voltage of 1.62 volts) and a minimum supply voltage of only 55% of the original supply voltage (i.e. a minimum supply voltage of 0.99 volts).

At relatively high or nominal supply voltages, voltage level shifting circuits 18 and 20 put bit line outputs 32 and 38 in a range where differential amplifier 22 will detect the differential voltage very quickly before the differential on outputs 32 and 38 cause transistors P1 and P2 to increase the differential. Therefore, transistors P1 and P2 have little effect on the overall operation of sense amplifier 10 at relatively high or nominal supply voltage levels The addition of transistors P1 and P2 in each sense amplifier also does not impact the sensing speed of sense amplifier 10 other than by adding an additional load of one transistor at the sense amplifier inputs. Transistors P1 and P2 therefore reduce the performance roll off of sense amplifier 10 at lower supply voltages and restore operation at lower supply voltages with very minimal impact to high voltage operation.

FIG. 2 is a diagram of a sense amplifier 50 according to an alternative embodiment of the present invention. The same reference numerals are used in the FIG. 2 as were use in FIG. 1 for the same or similar elements. Sense amplifier 50 is similar to sense amplifier 10, but further includes enable transistors P3 and P4. Enable transistors P3 and P4 are coupled between voltage supply terminal VDD and transistors P1 and P2, respectively. Enable transistor P3 is a P-channel transistor having a gate coupled to enable input 52, a source coupled to voltage supply terminal VDD and a drain coupled to the source of transistor P1. Transistor P4 is a P-channel transistor having a gate coupled to enable input 52, a source coupled to voltage supply terminal VDD and a drain coupled to the source of transistor P2.

During operation, enable signal EN applied to enable input 52 is held at a logic high level until the memory cell to which sense amplifier 50 is connected is read. When enable signal EN is high, transistors P3 and P4 are off and decouple transistors P1 and P2 from voltage supply terminal VDD. When enable signal EN transitions to a logic low level, transistors P3 and P4 turn on and couple transistors P1 and P2 to voltage supply terminal VDD. The remainder of the operation is the same as that of sense amplifier 10 described with reference to FIG. 1.

Although the present invention has been described with reference to preferred embodiments, workers skilled in the art will recognize that changes may be made in form and detail without departing from the spirit and scope of the invention. For example, the present invention can be implemented with various technologies in addition to CMOS. Various circuit configurations can be used. The transistors shown in the figures can include individual transistors or an array of transistors coupled together in parallel with one another. The voltage supply terminals can be relatively positive or relatively negative depending upon the particular convention adopted and the technology used and can include a power supply bus or a biased reference terminal having a voltage other than that of the power supply bus, for example. The terms "high" and "low" used in the specification and the claims are arbitrary terms and are interchangeable with a logical inversion of the circuit. Likewise, the term "coupled" can include various types of connections or couplings and can include a direct connection or a connection through one or more intermediate components.

What is claimed is:

1. A sense amplifier comprising:
   a voltage supply terminal;
   first and second differential bit line inputs;
   a differential amplifier comprising first and second amplifier inputs, which are coupled to the first and second differential bit line inputs, respectively, and an amplifier output;
   a first voltage compensation transistor coupled between the voltage supply terminal and the first bit line input and having a current control terminal coupled to the second bit line input; and
   a second voltage compensation transistor coupled between the voltage supply terminal and the second bit line input and having a current control terminal coupled to the first bit line input.

2. The sense amplifier of claim 1 wherein:
   the first voltage compensation transistor comprises a P-channel transistor having a gate coupled to the second bit line input, a source coupled to the voltage supply terminal and a drain coupled to the first bit line input and the first amplifier input; and
   the second voltage compensation transistor comprises a P-channel transistor having a gate coupled to the first bit line input, a source coupled to the voltage supply terminal and a drain coupled to the second bit line input and the second amplifier input.

3. The sense amplifier of claim 1 and further comprising:

a first voltage shifting circuit having an input coupled to the first bit line input and a voltage-shifted output coupled to the first amplifier input;

a second voltage shifting circuit having an input coupled to the second bit line input and a voltage-shifted output coupled to the second amplifier input;

wherein the first voltage compensation transistor is coupled between the voltage supply terminal and the voltage-shifted output of the first voltage shifting circuit and the current control terminal of the first voltage compensation transistor is coupled to the voltage-shifted output of the second voltage shifting circuit; and wherein the second voltage compensation transistor is coupled between the voltage supply terminal and the voltage-shifted output of the second voltage shifting circuit, and the current control terminal of the second voltage compensation transistor is coupled to the voltage-shifted output of the first voltage shifting circuit.

4. The sense amplifier of claim 1 and further comprising:

an enable input;

a third, enable transistor coupled between the first voltage compensation transistor and the voltage supply terminal and having a current control terminal coupled to the enable input; and a fourth, enable transistor coupled between the second voltage compensation transistor and the voltage supply terminal and having a current control terminal coupled to the enable input.

5. A sense amplifier comprising:

first and second differential bit line inputs;

a differential amplifier comprising first and second amplifier inputs, which are coupled to the first and second differential bit line inputs, respectively, and an amplifier output; and voltage compensation means coupled to the first and second bit line inputs for raising a first voltage level on one of the first and second bit line inputs when a second voltage level on the other of the first and second bit line inputs drops relative to the first voltage level.

6. The sense amplifier of claim 5 wherein the voltage compensation means comprises:

a voltage supply terminal;

a first voltage compensation transistor coupled between the voltage supply terminal and the first bit line input and having a current control terminal coupled to the second bit line input; and a second voltage compensation transistor coupled between the voltage supply terminal and the second bit line input and having a current control terminal coupled to the first bit line input.

7. The sense amplifier of claim 6 wherein:

the first voltage compensation transistor comprises a P-channel transistor having a gate coupled to the second bit line input, a source coupled to the voltage supply terminal and a drain coupled to the first bit line input and the first amplifier input; and the second voltage compensation transistor comprises a P-channel transistor having a gate coupled to the first bit line input, a source coupled to the voltage supply terminal and a drain coupled to the second bit line input and the second amplifier input.

8. The sense amplifier of claim 6 and further comprising:

a first voltage shifting circuit having an input coupled to the first bit line input and a voltage-shifted output coupled to the first amplifier input;

a second voltage shifting circuit having an input coupled to the second bit line input and a voltage-shifted output coupled to the second amplifier input;

wherein the first voltage compensation transistor is coupled between the voltage supply terminal and the voltage-shifted output of the first voltage shifting circuit and the current control terminal of the first voltage compensation transistor is coupled to the voltage-shifted output of the second voltage shifting circuit; and wherein the second voltage compensation transistor is coupled between the voltage supply terminal and the voltage-shifted output of the second voltage shifting circuit, and the current control terminal of the second voltage compensation transistor is coupled to the voltage-shifted output of the first voltage shifting circuit.

9. The sense amplifier of claim 6 and further comprising:

an enable input;

a third, enable transistor coupled between the first voltage compensation transistor and the voltage supply terminal and having a current control terminal coupled to the enable input; and a fourth, enable transistor coupled between the second voltage compensation transistor and the voltage supply terminal and having a current control terminal coupled to the enable input.

10. A method of sensing memory data represented by a differential voltage on first and second bit line inputs, wherein the first and second bit line inputs have first and second voltage levels, respectively, the method comprising:

reducing the first and second voltage levels on the first and second bit line inputs to third and fourth voltage levels;

raising one of the third and fourth voltage levels when the other of the third and fourth voltage levels drops relative to said one of the third and fourth voltage levels; and generating a data output based on a comparison of the third and fourth voltage levels.

* * * * *